United States Patent
Matsumoto

(10) Patent No.: US 9,055,674 B2
(45) Date of Patent: Jun. 9, 2015

(54) PRINTED CIRCUIT BOARD

(75) Inventor: Shoji Matsumoto, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 514 days.

(21) Appl. No.: 13/185,692

(22) Filed: Jul. 19, 2011

(65) Prior Publication Data
US 2012/0019331 A1   Jan. 26, 2012

(30) Foreign Application Priority Data

Jul. 26, 2010   (JP) .................................. 2010-166936

(51) Int. Cl.
| | |
|---|---|
| H05K 1/02 | (2006.01) |
| H04B 3/30 | (2006.01) |
| H04B 3/32 | (2006.01) |
| H03H 7/06 | (2006.01) |
| H05K 1/16 | (2006.01) |

(52) U.S. Cl.
CPC ................ *H05K 1/0231* (2013.01); *H03H 7/06* (2013.01); *H04B 3/30* (2013.01); *H04B 3/32* (2013.01); *H05K 1/0234* (2013.01); *H05K 1/0243* (2013.01); *H05K 1/162* (2013.01)

(58) Field of Classification Search
CPC . H05K 1/0231; H05K 1/0234; H05K 1/0216; H05K 1/0243; H05K 1/162; H03H 7/06
USPC ........... 333/1, 4, 5, 238, 246, 12, 172, 12.172
See application file for complete search history.

(56) References Cited

U.S. PATENT DOCUMENTS

| | | | | |
|---|---|---|---|---|
| 5,087,900 A | * | 2/1992 | Birchak et al. | 333/100 |
| 7,545,652 B2 | * | 6/2009 | Yamaguchi | 361/778 |
| 8,159,310 B2 | * | 4/2012 | Park et al. | 333/1 |

FOREIGN PATENT DOCUMENTS

JP   2001-257509 A   9/2001

OTHER PUBLICATIONS

Ajayna K.R., K.J.Vinoy, Planar Inter Digital Capacitors on Printed Circuit Board, Feb. 1, 2011, Department of Electrical Communication Engineering Indian Institue of Science, 560012, pp. 1-6.*

* cited by examiner

*Primary Examiner* — Benny Lee
*Assistant Examiner* — Jorge Salazar, Jr.
(74) *Attorney, Agent, or Firm* — Canon USA, Inc. IP Division

(57) ABSTRACT

A printed circuit board includes signal transmitting units that transmit signals, signal receiving units that receive signals, and a plurality of signal lines that connect the signal transmitting units and the signal receiving units. A resistor having a value Rp [Ω] of resistance with a first tolerance is provided between two signal lines that are adjacent to each other. In addition, a capacitor element that is connected in series to the resistor and that has a value Cp [F] of capacitance with a second tolerance is also connected between the two signal lines. In relation to the rise time tr [s] of the signals output from the signal transmitting units, the value Rp of resistance of the resistor and the value Cp of capacitance of the capacitor element are set such that an expression $(Cp \times Rp) \times 0.9 \leq tr/3 \leq (Cp \times Rp) \times 1.1$ is satisfied.

3 Claims, 13 Drawing Sheets

US 9,055,674 B2

PRINTED CIRCUIT BOARD

This application claims priority to foreign patent application JP-2010-166936 filed on Jul. 26, 2010.

BACKGROUND OF THE INVENTION

1. Field of the Invention

The present invention relates to a printed circuit board that reduces crosstalk noise generated between signal lines.

2. Description of the Related Art

A plurality of techniques are simultaneously being developed in order to realize electronic devices that have advanced capabilities. By one of such techniques, the transmission rate at which digital signals are transmitted in printed circuit boards incorporated into electronic devices is being increased. By another technique, the density of printed circuit boards incorporated into electronic devices is being increased.

When the transmission rate and the density are both improved at the same time, it is difficult to solve a problem related to crosstalk noise generated between signal lines. The factors related to the improvement of the transmission rate and the density in increasing crosstalk noise will be described. First, by increasing the transmission rate at which digital signals are transmitted, the rise time of the digital signals becomes short. The magnitude of crosstalk noise is proportional to the rate of change in the voltage in the waveform of a digital signal over time. Secondly, since the density is increased, the distances between signal lines become short, and therefore the magnitude of electromagnetic coupling between the signal lines becomes large. The magnitude of crosstalk noise is proportional to the magnitude of electromagnetic coupling between signal lines. As a result, an increase in the magnitude of crosstalk noise increases the possibility that a malfunction of a circuit is caused.

Now, the principle of the generation of crosstalk noise will be described. FIGS. 15A, 15B, and 15C are diagrams for explaining crosstalk noise generated in an existing printed circuit board. FIG. 15A is a diagram illustrating the structure of a circuit for explaining the principle of the generation of crosstalk noise. FIG. 15B is a graph illustrating the waveform of a signal and the waveforms of crosstalk noise. Signal transmitting units 203 and 204 are connected to one ends of a plurality of signal lines 201 and 202, respectively. Signal receiving units 205 and 206 are connected to another ends of the plurality of signal lines 201 and 202. A connection point between the signal line 201 and the signal receiving unit 205 is a receiving end 207, and a connection point between the signal line 202 and the signal receiving unit 206 is a receiving end 208.

The signal lines 201 and 202 that are arranged close to each other on a substrate each have a self-inductance Lo [H], and a coupled inductance Lm [H] exists between the signal lines 201 and 202. In addition, self-capacitances Co [F], which are capacitive components, exist between both the signal lines 201 and 202 and a ground layer (GND layer), and a coupled capacitance Cm [F], which is also a capacitive component, exists between the signal lines 201 and 202.

When a signal having an amplitude Vin [V] is output from the signal transmitting unit 203 with the rise time tr [s], the following theoretical formula of crosstalk noise observed at the receiving end 208 is obtained:

$$-0.5 \times Vin \times (Lo \times Co)^{1/2} \times (Lm/Lo - Cm/Co)/tr$$

The self-inductance Lo, the coupled inductance Lm, the self-capacitance Co, and the coupled capacitance Cm can be theoretically calculated from the structure of the printed circuit board such as the widths, the thicknesses, and the lengths of the signal lines 201 and 202, and the distances between the GND layer and both the signal lines 201 and 202.

The crosstalk noise generated at the receiving end 208 can be explained by dividing the phenomenon into two modes. One of the two modes is a differential mode, which is a state in which anti-phase crosstalk noise 401 having an amplitude whose sign is reversed from that of the amplitude of a signal 400 illustrated in FIG. 15B is generated. In this case, coupling between adjacent signal lines is considered to be inductive coupling, and Cm=0 in the expression (1). This mode can be expressed by a structure of a circuit coupled only by inductive components illustrated in FIG. 15A. The other mode is a common mode, which is a state in which crosstalk noise 402 having the same phase (the same sign of the amplitude) as the signal 400 illustrated in FIG. 15B is generated. In this case, coupling between adjacent signal lines is considered to be capacitive coupling, and Lm=0 in the expression (1). This mode can be expressed by a structure of a circuit coupled only by capacitive components illustrated in FIG. 15A.

In ordinary crosstalk noise, the crosstalk noises 401 and 402 are mixed. Because the inductive crosstalk noise 401 is dominant over the capacitive crosstalk noise 402 (Lm/Lo−Cm/Co>0) when a signal rises at the receiving end 208 in the printed circuit board, combined crosstalk noise 403 has an amplitude whose sign is reversed from that of the amplitude of the signal 400.

Crosstalk noise can be reduced by taking measures such as increasing the distance between adjacent signal lines or disposing the ground between signal lines, but the area of the printed circuit board is undesirably increased in these cases. In addition, as illustrated in FIG. 15C, in Japanese Unexamined Patent Application Publication No. 2001-257509, a capacitor 210 having a value Ca [F] of capacitance is connected between signal lines 201 and 202. At this time, a point of view on the characteristics for reducing the crosstalk noise is represented by the following expression (2):

$$Lm/Lo = (Cm + Ca)/Co \qquad (2)$$

However, in the above-described measures in an example of the related art, the effect of reducing the crosstalk noise is insufficient. Here, if ideal signal receiving units that have no parasitic capacitances are connected to signal lines, it can be theoretically confirmed that, by connecting a capacitor having a value Ca of capacitance that satisfies the expression (2) between the signal lines, the crosstalk noise can be sufficiently reduced. However, in practice, since signal receiving units that have parasitic capacitances are connected to signal lines, the parasitic capacitances of the signal receiving units also affect the magnitude of crosstalk noise. Therefore, even if the capacitor having the value Ca of capacitance that satisfies the expression (2) is connected, since parasitic capacitances of signal receiving units are not taken into consideration, the effect of reducing the crosstalk noise is small.

SUMMARY OF THE INVENTION

Therefore, the present invention provides a printed circuit board that further reduces the crosstalk noise without preventing realization of a high-speed or high-density circuit.

According to an aspect of the present invention, a printed circuit board includes signal transmitting units that transmit signals, signal receiving units that receive signals, and a plurality of signal lines that connect the signal transmitting units and the signal receiving units and that are arranged in parallel to one another. A resistor having a first tolerance and a capacitor having a second tolerance are connected in series between two signal lines that are adjacent to each other in the plurality of signal lines. If a value of resistance of the resistor is assumed to be Rp [Ω], a value of capacitance of the capacitor is assumed to be Cp [F], and rise time of the signals output from the signal transmitting units is assumed to be tr [s], the value Rp of resistance and the value Cp of capacitance are set such that an expression (Cp×Rp)×0.9≤tr/3≤(Cp×Rp)×1.1 is satisfied.

In addition, according to another aspect of the present invention, a printed circuit board includes signal transmitting units that transmit signals, signal receiving units that receive signals, and at least three signal lines that connect the signal transmitting units and the signal receiving units and that are arranged in parallel to one another. One ends of resistor elements that each have a first tolerance are connected to the at least three signal lines. A capacitor having a second tolerance is connected between another ends of, from among the resistor elements, resistor elements whose one ends are connected to two signal lines. If values of resistance of the resistor elements are assumed to be Rp/2 [Ω], a value of capacitance of the capacitor is assumed to be Cp [F], and rise time of the signals output from the signal transmitting units is assumed to be tr [s], the value Rp of resistance and the value Cp of capacitance are set such that an expression (Cp×Rp)×0.9≤tr/3≤(Cp×Rp)×1.1 is satisfied.

Further features of the present invention will become apparent from the following description of exemplary embodiments with reference to the attached drawings.

DESCRIPTION OF THE EMBODIMENTS

Embodiments of the present invention will be described hereinafter in detail with reference to the drawings.

First Embodiment

Figure 1:
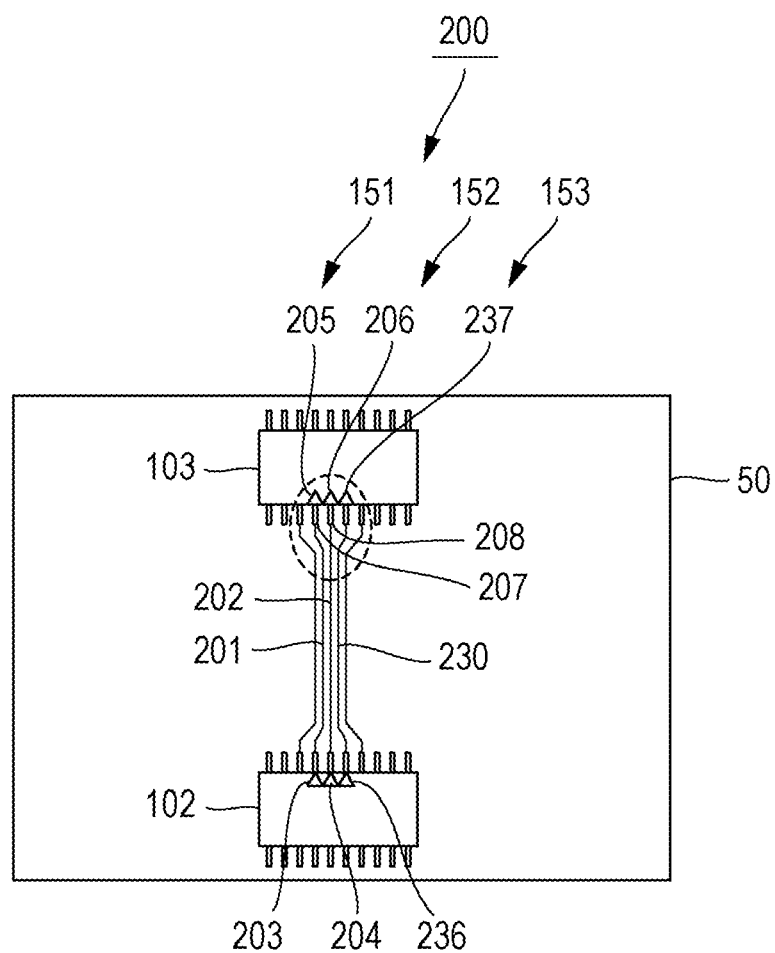
FIG. 1 is a conceptual diagram illustrating a printed circuit board according to an embodiment of the present invention.
Figure 2:
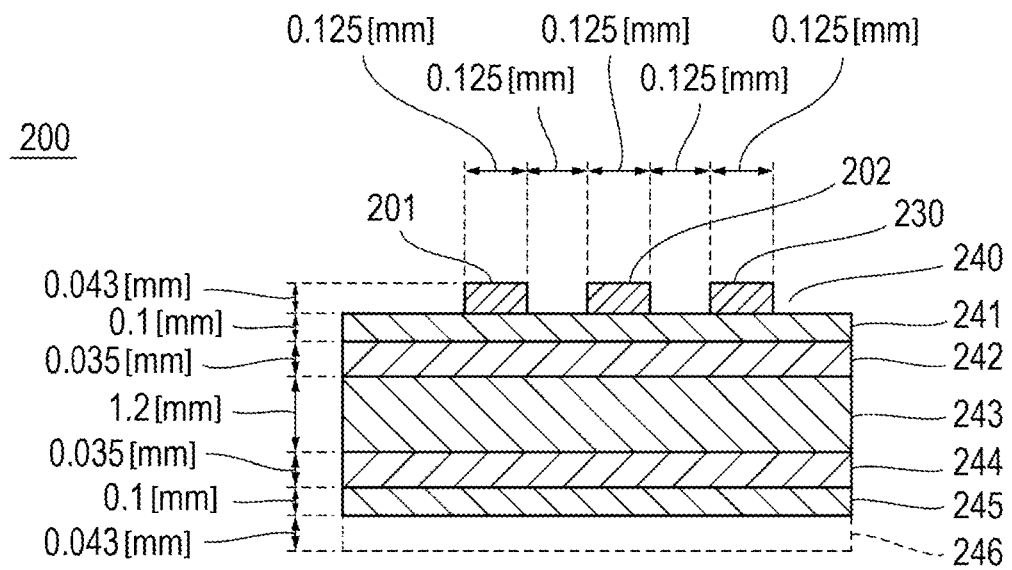
FIG. 2 is a sectional view of the printed circuit board according to the embodiment of the present invention.

FIG. 1 is a diagram illustrating the schematic configuration of a printed circuit board according to a first embodiment of the present invention. FIG. 2 is a sectional view of the printed circuit board. As illustrated in FIG. 1, a printed circuit board 200 has a substrate 50 and integrated circuits (ICs) 102 and 103 mounted on the substrate 50. As illustrated in FIG. 2, the substrate 50 is a four-layer substrate. A first layer is a signal line layer 240, a second layer is a ground layer 242, a third layer is a power supply layer 244, and a fourth layer is a signal line layer 246. Between the signal line layer 240 and the ground layer 242, between the ground layer 242 and the power supply layer 244, and between the power supply layer 244 and the signal line layer 246, insulation layers 241, 243, and 245, respectively, are provided. The ICs 102 and 103 are mounted on the signal line layer 240.

As illustrated in FIG. 1, the IC 102 has a plurality of signal transmitting units that transmit (output) signals. In addition, the IC 103 has a plurality of signal receiving units that receive (input) signals. A transmission circuit, which is a transmission element that constitutes a part of the signal transmitting units, is incorporated into the IC 102, and a receiving circuit, which is a receiving element that constitutes a part of the signal receiving units, is incorporated into the IC 103. FIG. 1 illustrates three signal transmitting units 203, 204, and 236 and three signal receiving units 205, 206, and 237. The signal transmitting units 203, 204, and 236 and the signal receiving units 205, 206, and 237 are connected by signal lines 201, 202, and 230, respectively, provided on the substrate 50. As illustrated in FIG. 2, the signal lines 201, 202, and 230 are micro-strip lines provided on the signal line layer 240. That is, the printed circuit board 200 has a plurality of signal transmitting/receiving systems that each include a signal transmitting unit, a signal receiving unit, and a signal line. More specifically, as illustrated in FIG. 1, a signal transmitting/receiving system 151 includes the signal transmitting unit 203, the signal receiving unit 205, and the signal line 201. In addition, a signal transmitting/receiving system 152 includes the signal transmitting unit 204, the signal receiving unit 206, and the signal line 202, and a signal transmitting/receiving system 153 includes the signal transmitting unit 236, the signal receiving unit 237, and the signal line 230. A connection point between the signal line 201 and the signal receiving unit 205 is a receiving end 207. In addition, a connection point between the signal line 202 and the signal receiving unit 206 is a receiving end 208. The signal lines 201, 202, and 230 are arranged in parallel to one another and, in order to increase the wiring density, close to one another.

Figure 3:
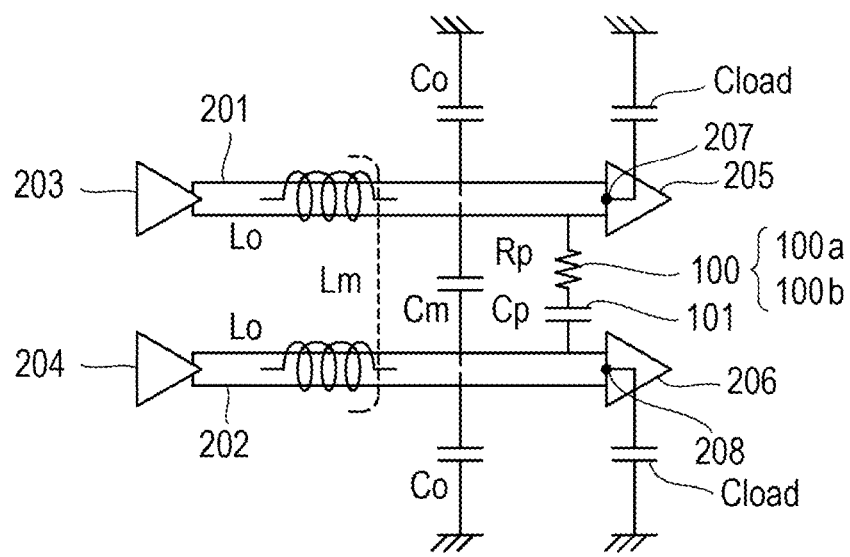
FIG. 3 is a diagram illustrating an equivalent circuit of the printed circuit board according to the embodiment of the present invention.

FIG. 3 is a diagram illustrating an equivalent circuit of the printed circuit board 200. The two signal lines 201 and 202 arranged on the substrate 50 close to each other each have a self-inductance Lo [H], and a coupled inductance Lm [H] exists between the signal lines 201 and 202. In addition, self-capacitances Co [F], which are capacitive components, exist between both the two signal lines 201 and 202 and the ground layer 242, and a coupled capacitance Cm [F], which is also a capacitive component, exists between the two signal lines 201 and 202. Furthermore, the signal receiving units 205 and 206 each have a parasitic capacitance Cload [F]. It is to be noted that a coupling coefficient between two signal lines is k (=Lm/Lo).

In the first embodiment, the printed circuit board 200 has a resistor 100 that is provided between the two signal lines 201 and 202 adjacent to each other in the plurality of signal lines and that has a value Rp [Ω] of resistance with a first tolerance. In addition, the printed circuit board 200 has a capacitor element 101 as a capacitor that is provided between the two signal lines 201 and 202, that is connected in series to the resistor 100, and that has a value Cp [F] of capacitance with a second tolerance. That is, a series circuit in which the resistor 100 and the capacitor element 101 are connected in series is connected between the two signal lines 201 and 202. The resistor 100 and the capacitor element 101 reduce crosstalk noise generated at the signal receiving units 205 and 206 and are arranged close to the signal receiving units 205 and 206. It is to be noted that, although not illustrated in FIG. 3, a series circuit including a resistor and a capacitor is also connected between any two other signal lines, which are not illustrated.

The resistor 100 includes two resistor elements 100a and 100b that each have a value Rp/2 [Ω] of resistance with the first tolerance. That is, the value Rp of resistance of the resistor 100 is the sum of the values Rp/2 of resistance of the two resistor elements 100a and 100b. The values Rp/2 of resistance of the resistor elements 100a and 100b are nominal values, which each have the first tolerance (for example, ±5%). In addition, the value Cp of capacitance of the capacitor element 101 is a nominal value, which has the second tolerance (for example, ±5%).

Figure 4A:
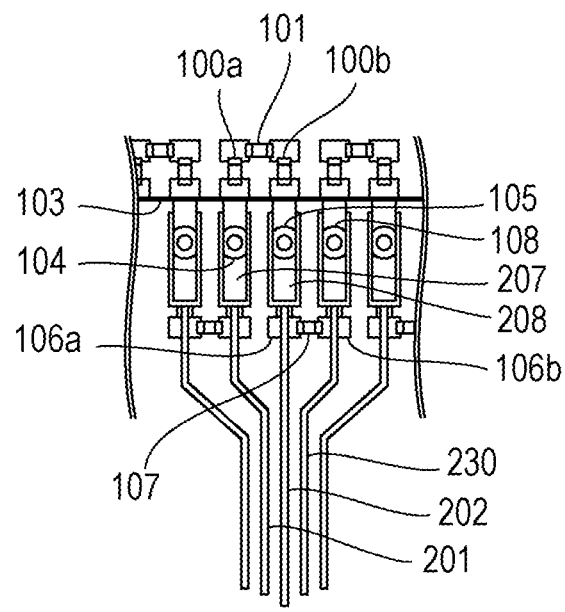
FIGS. 4A and 4B are conceptual diagrams illustrating the connection state of each element around signal receiving units.
Figure 4B:
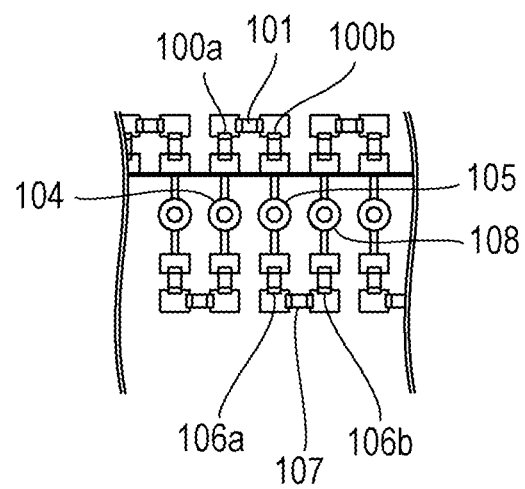

FIGS. 4A and 4B are diagrams illustrating the connection state of each element around the signal receiving units. FIG. 4A is a perspective plan view of the signal line layer 240, which is the first layer of the printed circuit board 200 (substrate 50), and the signal line layer 246, which is the fourth layer of the printed circuit board 200 (substrate 50), that are overlapped for explanatory purposes. FIG. 4B is a plan view of the signal line layer 246, which is the fourth layer.

Whereas the ICs 102 and 103 and the signal lines 201, 202, and 230 are provided on the signal line layer 240, which is one face of the substrate 50, the resistor elements 100a and 100b of the resistor 100 and the capacitor element 101 are provided on the signal line layer 246, which is another face of the substrate 50.

Via holes 104, 105, and 108, which are through holes, are formed in the substrate 50 of the printed circuit board 200. On the signal line layer 240, the signal lines 201, 202, and 230 run to the via holes 104, 105, and 108, respectively. Between the two signal lines 201 and 202, the resistor element 100a, the capacitor element 101, and the resistor element 100b provided on the signal line layer 246 are connected through the via holes 104 and 105. More specifically, a series circuit in which the capacitor element 101 is connected between the resistor elements 100a and 100b is provided on the signal line layer 246, and connected between the two signal lines 201 and 202 through the via holes 104 and 105. Similarly, between the signal lines 202 and 230, another series circuit in which a resistor element 106a, a capacitor element 107, and a resistor element 106b are configured in the same manner as the resistor element 100a, the capacitor element 101, and the resistor element 100b is connected through the via holes 105 and 108.

More specifically, one terminal of the resistor element 100a is connected to the signal line 201 through the via hole 104. Another terminal of the resistor element 100a is connected to one terminal of the capacitor element 101. Another terminal of the capacitor element 101 is connected to one terminal of the resistor element 100b. Another terminal of the resistor element 100b is connected to the signal line 202 through the via hole 105. In addition, one terminal of the resistor element 106a is connected to the signal line 202 through the via hole 105. Another terminal of the resistor element 106a is connected to one terminal of the capacitor element 107. Another terminal of the capacitor element 107 is connected to one terminal of the resistor element 106b. Another terminal of the resistor element 106b is connected to the signal line 230 through the via hole 108.

It is to be noted that, although the resistor element 100a, the resistor element 100b, the capacitor element 101, the resistor element 106a, the resistor element 106b, and the capacitor element 107 are arranged close to the IC 103, there are no restrictions on positions at which these components are to be arranged, such as distances to the IC 103 and faces of the printed circuit board 200 on which the components are to be arranged. Any type of arrangement is possible so long as these components are connected to the signal line 201, 202, or 230 as described above. In addition, the resistor elements 100a and 100b, the capacitor element 101, the resistor elements 106a and 106b, and the capacitor element 107 may be configured by a plurality of materials. If the resistor elements 100a and 100b, the capacitor element 101, the resistor elements 106a and 106b, and the capacitor element 107 are configured by a plurality of materials, the sum of the characteristics of each material needs to exhibit the same state as the equivalent circuit illustrated in FIG. 3.

Next, the principle of the reduction of crosstalk noise will be described. The behavior of the voltages at the receiving ends 207 and 208 when the signal transmitting unit 203 outputs a signal and the signal transmitting unit 204 does not output a signal will be described hereinafter. As described with respect to the related art, the expression (1) represents the magnitude of crosstalk noise. On the basis of the expression (1), the following condition for reducing the crosstalk to zero can be obtained:

$$(Lm/Lo-Cm/Co)=0 \quad (3)$$

However, because the voltages at the receiving ends 207 and 208 are affected by the parasitic capacitances Cload of the signal receiving units 205 and 206 connected to the signal lines 201 and 202, respectively, the expression (3) is corrected in view of the parasitic capacitances Cload and the following expression (4) is obtained:

$$(Lm/Lo-Cm/(Co+Cload))=0 \quad (4)$$

Here, in order to reduce inductive crosstalk noise that is dominant at the receiving end 208, capacitive coupling needs to be increased. The capacitive coupling can be improved by connecting the capacitor element 101 having a value Cp of capacitance between the two signal lines 201 and 202. The expression (4) is corrected and the following expression (5) is obtained:

$$(Lm/Lo-(Cp+Cm)/(Co+Cload))=0 \quad (5)$$

Here, if Lm/Lo=k (coupling coefficient of signal lines) and the expression (5) is rearranged, the following expression (6) is obtained:

$$Cp=k\times(Co+Cload)-Cm \quad (6)$$

The above description is a point of view in which the effect of the parasitic capacitances Cload of the signal receiving units 205 and 206 are taken into consideration. A specific example will be described hereinafter. In the following description, as illustrated in FIG. 2, the thicknesses, the lengths, and the widths of the signal lines 201, 202, and 230 are assumed to be 0.043 mm, 5 cm, and 0.125 mm, respectively. In addition, the thickness of the insulation layer 241 is assumed to be 0.1 mm and the relative dielectric constant of the insulation layer 241 is assumed to be 4.3. The thickness of the ground layer 242 is assumed to be 0.035 mm. In addition, the thickness of the insulation layer 243 is assumed to be 1.2 mm, that of the power supply layer 244 is assumed to be 0.035 mm, that of the insulation layer 245 is assumed to be 0.1 mm, and that of the signal line layer 246 is assumed to be 0.043 mm. The smallest gaps between the signal lines 201 and 202 and between the signal lines 202 and 230 are assumed to be 0.125 mm. The pitch of the receiving ends 207 and 208 is assumed to be 0.65 mm. The gaps between the signal lines 201, 202, and 230 are larger than the smallest gaps at portions closer to the signal receiving units 205, 206, and 237 to which the signal lines 201, 202, and 230 are connected. When an electromagnetic field analysis is conducted with this sectional structure, Lo=16 [nH], Co=6.0 [pF], Lm=3.5 [nH], and Cm=0.96 [pF], if the lengths of the signal lines of 5 cm are taken into consideration. The parasitic capacitances Cload of the signal receiving units 205 and 206 are assumed to be 3.0 pF. Thus, the capacitance Cp of the capacitor element 101 necessary to reduce the crosstalk noise in a circuit that operates at several hundred MHz or more is, on the basis of the expression (6), Cp=k×(Co+Cload)−Cm≈1.0 [pF].

Figure 5:
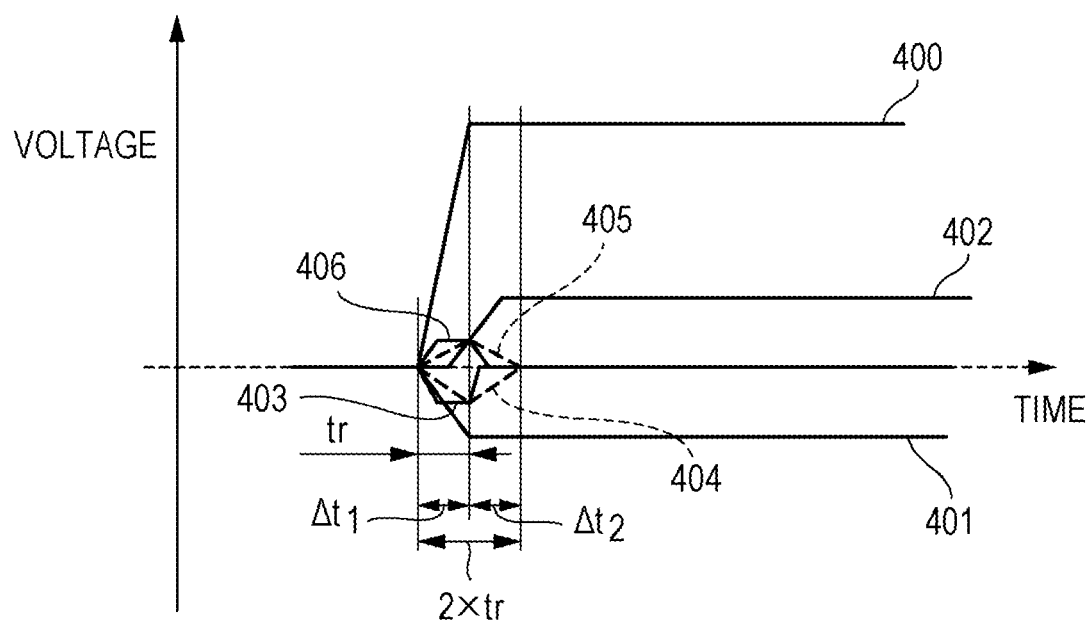
FIG. 5 is a graph illustrating the waveform of a signal and the waveforms of crosstalk noise.

Next, how the crosstalk noise changes over time will be described. FIG. 5 is a diagram illustrating a the waveform of a signal and the waveforms of crosstalk noise. A signal 400 is a digital signal that is transmitted through the signal line 201 and that has rise time tr [s]. When the signal 400 is transmitted through the signal line 201, inductive crosstalk noise 401 in a differential mode and capacitive crosstalk noise 402 in a common mode are generated at the receiving end 208 of the signal line 202. If there were no parasitic capacitance Cload, crosstalk noise 403, which is composed of the crosstalk noises 401 and 402, would be generated at the receiving end 208. In that case, the amplitude of the crosstalk noise 403 at the receiving end 208 would immediately reach the peak voltage and remain approximately at the peak voltage until the end of the rise of the signal 400. After the amplitude of the signal 400 has become constant, the crosstalk noise 403 would immediately decrease to zero.

In practice, however, there are parasitic capacitances Cload of the signal receiving units 205 and 206, and therefore crosstalk noise 404, which is indicated in FIG. 5 by a broken line, is generated at the receiving end 208. The crosstalk noise 404 does not immediately reach the peak voltage unlike the crosstalk noise 403 due to the parasitic capacitances Cload. The crosstalk noise 404 increases in the negative voltage direction in accordance with the rise of the signal 400 and reaches the peak voltage approximately at the end of the rise time tr of the signal 400. When the amplitude of the signal 400 has become constant after the rise of the signal 400, the crosstalk noise 404 decreases to zero over the approximately same period as the rise time tr of the signal 400.

Now, a period of time in which the capacitor element 101 having a value Cp [F] of capacitance charges and discharges will be considered, while supposing that the resistor elements 100a and 100b of the resistor 100 are not connected. In general, a period of time in which a capacitor element charges and discharges is controlled by a CR time constant, which is a product of a value C of capacitance and a value R of resistance connected to a capacitor. When only the capacitor element 101 is used, a value of resistance in a circuit can be calculated from only the parasitic resistances of components. The value is generally 1Ω or less. In the above-described specific example, the value of capacitance of the capacitor element 101 is Cp≈1.0 [pF]. Therefore, the CR time constant, which is a product of a value of capacitance of a capacitive component and a value of resistance, is 1 ps or less.

However, the rise time tr of the signal 400 that operates at several hundred MHz or more is, for example, 100 to 500 ps. Therefore, the CR time constant at a time when it is supposed that there is no resistor 100 corresponding to an example of the related art is sufficiently small relative to the rise time of the signal 400. For this reason, when it is supposed that only the capacitor element 101 is connected, a period of time during which the effect of reducing the crosstalk noise is generated by the capacitor element 101 is shorter than the time tr over which the crosstalk noise 404 reaches the peak voltage as illustrated in FIG. 5 by a voltage 406. That is, the capacitor element 101 by itself does not have a sufficient effect of eliminating the crosstalk noise 404.

On the other hand, in this first embodiment, the resistor elements 100a and 100b are connected in series to both ends of the capacitor element 101. In this first embodiment, the values Rp/2 [Ω] of resistance of the resistor elements 100a and 100b control the speed of the effect of reducing the crosstalk noise using the CR time constant.

The setting of the value Rp [Ω] of resistance of the resistor 100 will be described hereinafter in detail. The equivalent circuit of the printed circuit board 200 is as illustrated in FIG. 3, and the resistor elements 100a and 100b are considered as the single resistor 100. The speed at which the amplitude of voltage generated to reduce the crosstalk noise generated at the receiving end 208 changes is controlled by the CR time constant, which is a product of the value Cp of capacitance of the capacitor element 101 and the value Rp of resistance of the resistor 100 between the signal lines 201 and 202. Therefore, transitional changes in the voltage in a CR series circuit composed of the capacitor element 101 and the resistor 100 will be considered. The crosstalk noise generated by the signal 400 is assumed to be Vn.

If t denotes the variable of time, the voltage of the capacitor element 101 is represented by an expression Vn−Vn×exp(−t/(Cp×RP)). Voltages at both ends of the capacitor element 101 at a moment when the signal 400 reaches the receiving end 207 are 0 V, and then the voltage of the capacitor element 101 gradually increases. This voltage generated at the capacitor element 101 has an effect of eliminating Vn. The voltage of the capacitor element 101 gradually approaches Vn, increasing from about 0.63Vn V when t=Cp×Rp, to about 0.86Vn V when t=2×Cp×Rp, to about 0.95Vn V when t=3×Cp×Rp, and then to about 0.98Vn V when t=4×Cp×Rp. The crosstalk noise when there are parasitic capacitances of the signal receiving units 205 and 206 reaches the peak voltage over the time tr after the generation as illustrated in FIG. 5. Therefore, the voltage for eliminating this crosstalk noise during a period Δt1 from the beginning of the rise of the signal 400 to a moment at which the signal 400 has risen over the time tr is not sufficient when t=Cp×Rp or t=2×Cp×Rp. On the other hand, when t=3×Cp×Rp, the voltage of the capacitor element 101 reaches about 95% of Vn. Therefore, by setting the values of the resistor 100 and the capacitor element 101 such that the following expression (7) is satisfied, the effect of eliminating the crosstalk noise reaches 95% when the crosstalk noise reaches the peak voltage after the time tr has elapsed since the generation of the crosstalk noise, and therefore the crosstalk noise can be substantially eliminated.

$$tr/3 = Cp \times Rp \tag{7}$$

Figure 6:
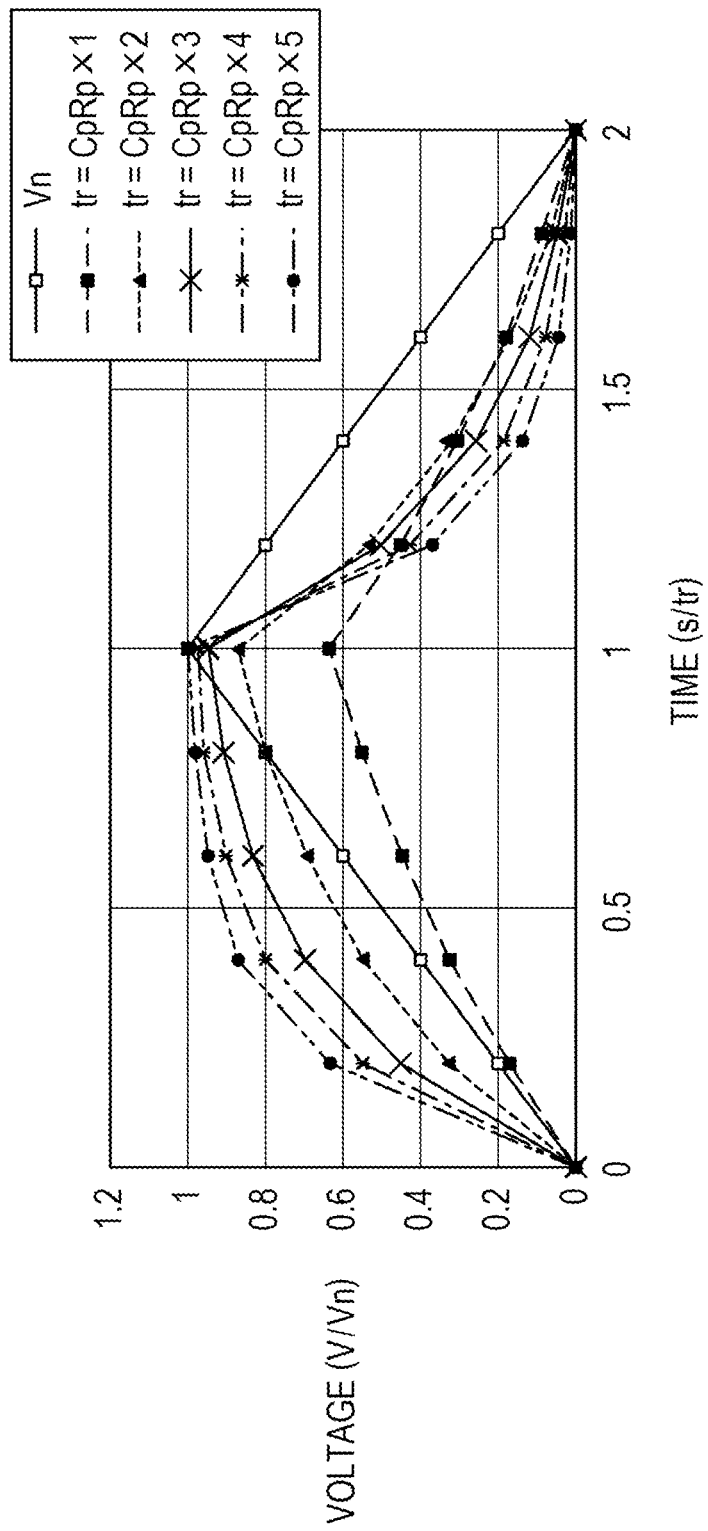
FIG. 6 is a graph illustrating changes in crosstalk noise and the effect of eliminating the crosstalk noise over time.

FIG. 6 is a graph illustrating changes in the crosstalk noise and the effect of eliminating the crosstalk noise over time. It is to be noted that the voltage axis is standardized by Vn and the time axis is standardized by tr. In addition, in FIG. 6, voltage waveforms of the capacitor element 101 for coefficients of Cp×Rp are superimposed. The crosstalk noise Vn increases in a substantially linear manner over time (the sign is inversed in the graph). When the coefficient is 3 or more, a period of time over which the voltage of the capacitor element 101 sufficiently approaches Vn becomes shorter during the period Δt1 illustrated in FIG. 5 as the coefficient becomes larger. However, when the crosstalk noise decreases from the peak value, that is, during a period Δt2 from a moment at which the output voltage is reached over the time tr to a moment at which the time 2×tr has elapsed, a period of time during which the effect of eliminating the crosstalk noise is generated by the voltage of the capacitor element 101 becomes undesirably shorter as the coefficient becomes larger. Therefore, during the period Δt2 after the time tr has elapsed, the effect of reducing the crosstalk noise becomes smaller as the coefficient becomes larger.

Therefore, the value Rp [Ω] of resistance of the resistor 100 and the value Cp [F] of capacitance of the capacitor element 101 are set while satisfying the expression tr/3=Cp×Rp, balancing both the periods Δt1 and Δt2. It is to be noted that, in this first embodiment, since the value Cp of capacitance is set in accordance with the expression (6), the value Rp [Ω] of resistance of the resistor 100 is set such that the expression (7) is satisfied.

If the value Rp of resistance is set such that the expression (7) is satisfied as described above, a voltage 405 (indicated by a broken line) generated to reduce the crosstalk noise reaches 95% after the elapse of the time tr, that is, after the rise of the signal 400, as illustrated in FIG. 5. Therefore, the crosstalk noise can be sufficiently reduced.

On the other hand, since there are the parasitic capacitances Cload of the signal receiving units 205 and 206 even after the value of the amplitude of the signal 400 becomes constant, the crosstalk noise 404 decreases to zero over the time tr, as when the crosstalk noise 404 increased. At this time, the voltage 405 for eliminating the crosstalk noise generated at the receiving end 208 decreases by about 95% when a period of time of 3×Cp×Rp has elapsed after the end of the rise of the signal 400. Thus, the voltage 405 for reducing the crosstalk noise 404 decreases as the crosstalk noise 404 decreases. Therefore, a sufficient effect of reducing the crosstalk noise can be obtained. In the above-described principle, the waveform of the crosstalk noise 404 generated at the receiving end 208 and the waveform of the voltage 405 generated to reduce the crosstalk noise 404 become substantially symmetrical. Thus, crosstalk noise can be effectively eliminated at a moment at which the crosstalk noise reaches a peak value. Therefore, the peak value of the crosstalk noise can be decreased without preventing realization of a high-speed or high-density circuit.

The setting of the values of resistance of the resistor elements 100a and 100b of the resistor 100 will be described hereinafter using a specific example under the same conditions as illustrated in FIG. 2. Here, the value Cp of the capacitance of the capacitor element 101 is 1.0 pF as described above. The dimensions of the resistor elements 100a, 100b, 106a, and 106b are 0.4 mm×0.2 mm. The dimensions of the capacitor elements 101 and 107 are also 0.4 mm×0.2 mm.

If the rise time tr of the signal 400 is assumed to be 500 ps, the value of resistance of the resistor 100 is Rp=tr/(3×Cp) =166 [Ω] from the expression (7). Therefore, the values Rp/2 of resistance of the two resistor elements 100a and 100b are 83Ω, and resistor elements having a nominal value of 83Ω can be selected as the resistor elements 100a and 100b. If the parasitic capacitances of signal receiving units are not considered as in the example of the related art, Ca=0.35 [pF] from the expression (2) Lm/Lo=(Cm+Ca)/Co.

Now, the CR time constant in each condition and the rise time tr of the signal 400 are compared. In the example of the related art, if the value Ca of capacitance of a capacitor is assumed to be 0.35 pF and the values of resistance of resistor elements are assumed to be 1.0Ω, the CR time constant is 0.35 ps. If a resistor is not used even when the parasitic capacitances Cload of the signal receiving units 205 and 206 are taken into consideration, and if the value Cp of capacitance is assumed to be 1.0 pF and the values of resistance of resistor elements are assumed to be 1.0Ω, the CR time constant is 1.0 ps. On the other hand, in the case of this first embodiment, if the value Cp of capacitance is assumed to be 1.0 pF and the value Rp of resistance is assumed to be 166Ω, the CR time constant is 166 ps. When only the capacitor is used, since the CR time constant is sufficiently small relative to the rise time tr of 500 ps, the effect of reducing the crosstalk noise that remains after the end of the rise of a signal is small.

Figure 7A:
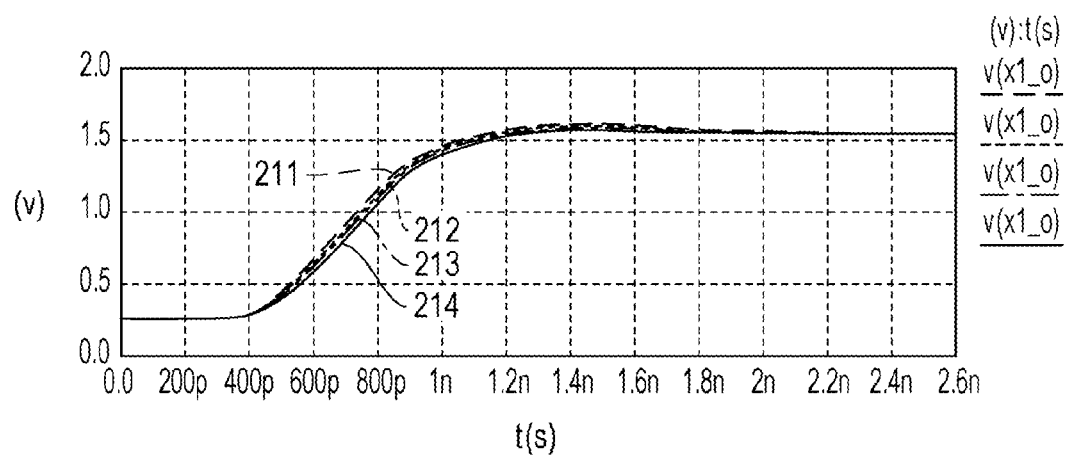
FIGS. 7A and 7B are graphs illustrating the results of simulation of the waveform of the crosstalk noise.
Figure 7B:
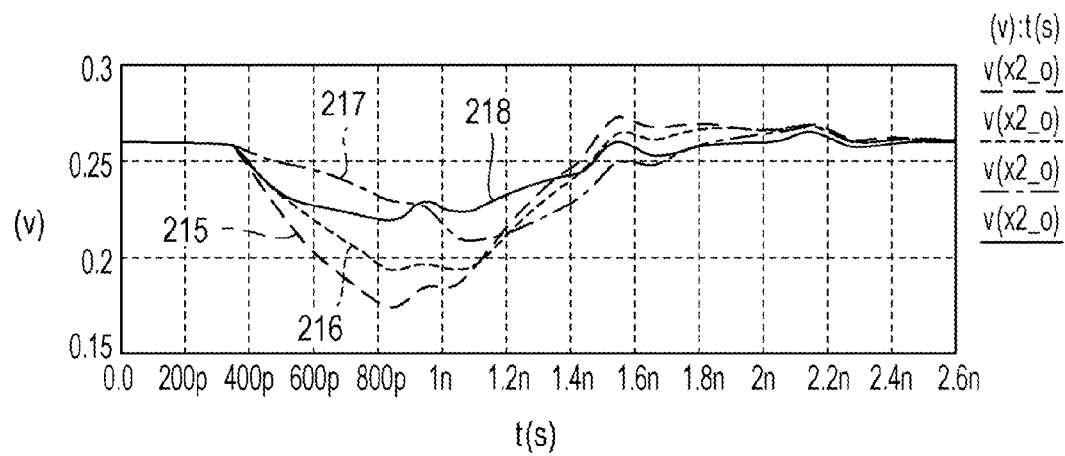

In addition, the results of simulation of the waveform of crosstalk noise using the above parameters are illustrated in FIGS. 7A and 7B. The vertical axes represent voltage, and the horizontal axes represent time. FIG. 7A is a diagram illustrating waveforms at the receiving end 207 of the signal line 201 through which a signal is transmitted. A waveform 211 is a waveform when no measures are taken against the crosstalk noise, that is, when the capacitor element 101 and the resistor 100 are not connected. A waveform 212 is a waveform when only a capacitor element having a value Ca of capacitance in the example of the related art is connected. A waveform 213 is a waveform when, although the effect of the parasitic capacitances Cload of the signal receiving units 205 and 206 are taken into consideration, the resistor 100 is not connected and only the capacitor element 101 having the value Cp of capacitance is connected. A waveform 214 is a waveform according to this first embodiment in which the capacitor element 101 having the value Cp of capacitance and the resistor 100 having the value Rp of resistance are connected. As illustrated in FIG. 7A, the waveforms 212 to 214 are substantially the same.

FIG. 7B is a diagram illustrating the waveforms of crosstalk noise at the receiving end 208. A waveform 215 is a waveform when no measures are taken against the crosstalk noise, that is, when the capacitor element 101 and the resistor 100 are not connected. A waveform 216 is a waveform when only a capacitor element having a value Ca of capacitance in the example of the related art is connected. A waveform 217 is a waveform when, although the effect of the parasitic capacitances Cload of the signal receiving units 205 and 206 are taken into consideration, the resistor 100 is not connected and only the capacitor element 101 having the value Cp of capacitance is connected. A waveform 218 is a waveform according to this first embodiment in which the capacitor element 101 having the value Cp of capacitance and the resistor 100 having the value Rp of resistance are connected. In the waveform 218 according to this first embodiment, the peak value of the crosstalk noise is smaller than in the waveforms 215, 216, and 217.

The values of resistance of the resistor elements 100a and 100b are calculated above, but there may be no resistor elements having nominal values that match the calculated values. In that case, resistor elements having nominal values closest to the calculated values may be used as the resistor elements 100a and 100b. That is, "setting the value Rp of resistance of the resistor 100 such that the expression tr/3=Cp×Rp is satisfied" includes a case in which there is an error between the value calculated for selecting an actual resistor element and the actual value of resistance of the selected resistor element. This holds true for the capacitor element 101. That is, "setting the value Cp of capacitance of the capacitor element 101 such that the expression tr/3=Cp×Rp is satisfied" includes a case in which there is an error between the value calculated for selecting an actual capacitor element and the actual value of capacitance of the selected capacitor element.

The values of resistance of the resistor elements 100a and 100b normally have tolerances (errors), and the value of capacitance of the capacitor element 101 also has a tolerance (error). Therefore, "values that satisfy the expression tr/3=Cp×Rp" may be values that include these tolerances. For example, if the tolerances of the values of resistance of the resistor elements 100a and 100b are assumed to be ±5% and the tolerance of the value of capacitance of the capacitor element 101 is assumed to be ±5%, the value obtained from the expression tr/3=Cp×Rp may be a value that includes an error of ±10%. Therefore, if the capacitor element 101 and the resistor elements 100a and 100b are configured by chip elements, an error in Cp×Rp is ±10% at maximum.

Figure 8A:
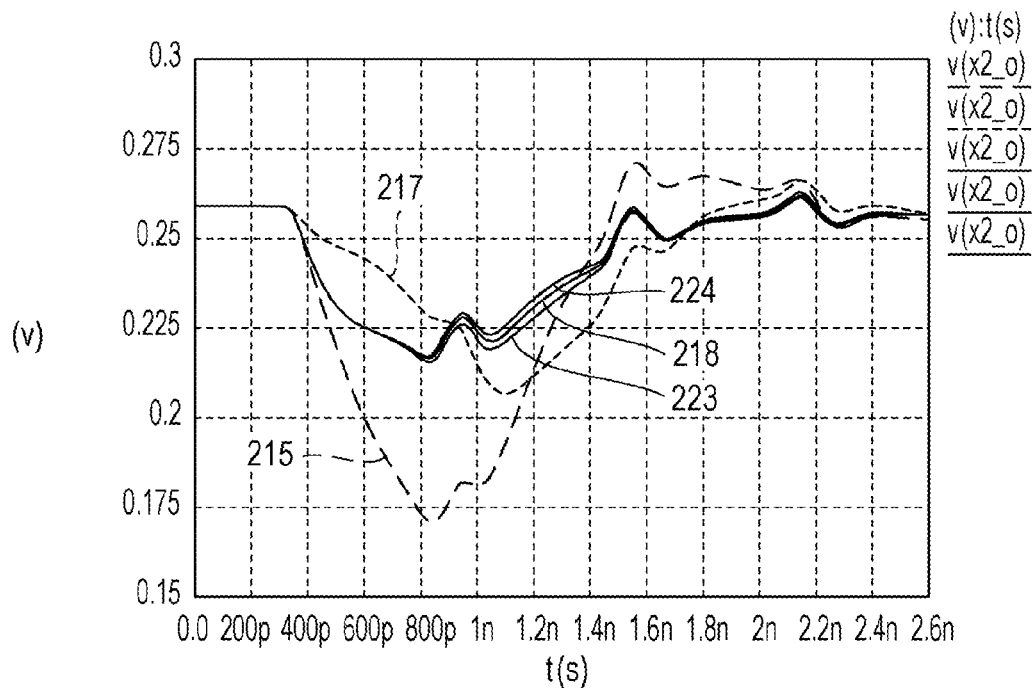
FIGS. 8A and 8B are graphs illustrating waveforms, which are the results of simulation analyses conducted within the range of errors of elements.

A simulation analysis of crosstalk noise when tr=500 [ps] and Cp×Rp=166±10% (150 to 183) [ps] was conducted as described below. When Cp×Rp=150 [ps], Cp=0.95 [pF] and Rp=158 [Ω]. When Cp×Rp=183 [ps], Cp=1.05 [pF] and Rp=174 [Ω]. FIG. 8A illustrates the results of the simulation. The vertical axis represents voltage, and the horizontal axis represents time. A waveform 223 is a waveform of the crosstalk noise when Cp×Rp=150 [ps]. A waveform 224 is a waveform of the crosstalk noise when Cp×Rp=183 [ps]. Both the waveform 223 and the waveform 224 are not significantly different from the waveform 218 and the peak values of the crosstalk noise therein are lower than that in the waveform 217. Therefore, in consideration of the tolerances of the resistor elements 100a and 100b and the capacitor element 101, if a range (Cp×Rp)×0.9≤tr/3≤(Cp×Rp)×1.1 is satisfied, the peak value of the crosstalk noise can be reduced.

Figure 8B:
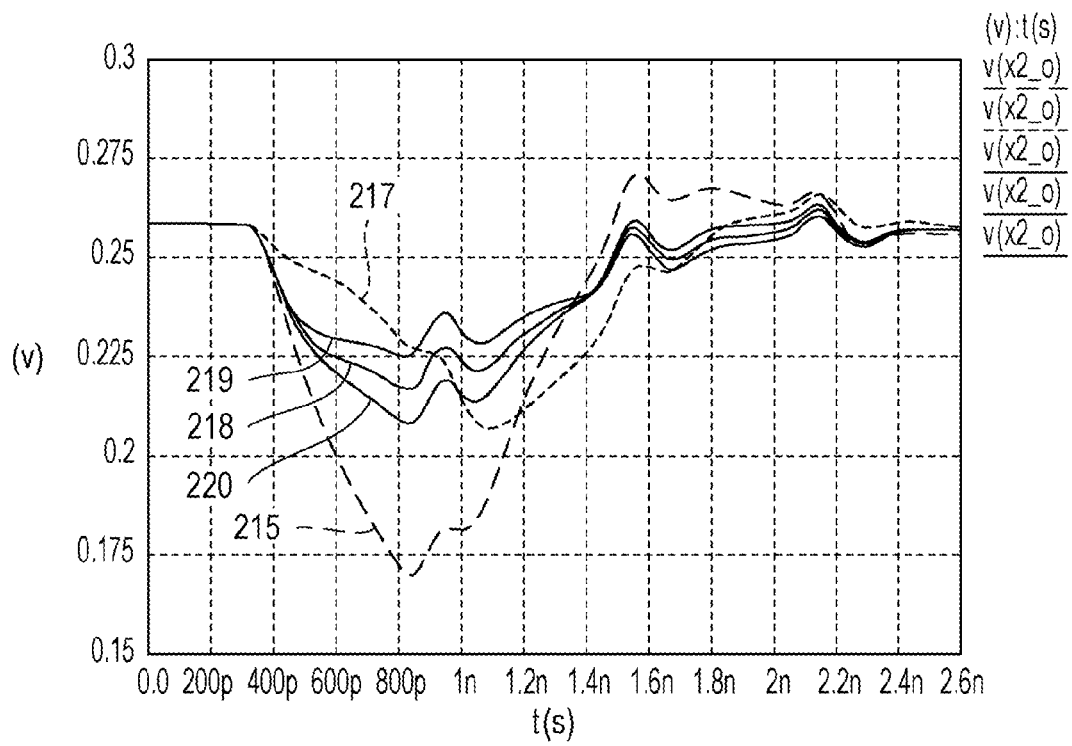

In addition, so long as the expression tr/3=Cp×Rp is satisfied, the expression Cp=k×(Co+Cload)−Cm need not be strictly satisfied, that is, it is acceptable if the expression Cp=k×(Co+Cload)−Cm is substantially satisfied. If the value Cp of capacitance is changed within the range of about −20% to 20%, the value Rp of resistance may be changed within a range in which the expression tr/3=Cp×Rp is satisfied, and the effect of reducing the peak value of the crosstalk noise can be obtained. FIG. 8B illustrates the results of the simulation analysis. The vertical axis represents voltage and the horizontal axis represents time. A waveform 219 is a waveform when the value Cp (=1.0 pF) of capacitance has been increased by 20% and the value Rp of resistance has been set such that the expression tr/3=Cp×Rp is satisfied. A waveform 220 is a waveform when the value Cp (=1.0 pF) of capacitance has been decreased by 20% and the value Rp of resistance has been set such that the expression tr/3=Cp×Rp is satisfied. As illustrated in FIG. 8B, in the waveforms 218, 219, and 220 according to this first embodiment, the peak values of the crosstalk noise are smaller than in the waveform 217.

It is to be noted that, if the value Cp of capacitance is increased by more than 20%, the effect of eliminating the crosstalk noise, the effect being produced by the voltage of the capacitor element 101, becomes larger than the crosstalk noise, thereby making the effect itself be noise. Therefore, the upper limit is about 20%. In addition, if the value Cp of capacitance is further decreased, the effect of eliminating the crosstalk noise, the effect being produced by the voltage of the capacitor element 101, becomes small. Therefore, the lower limit is about −20%. Thus, by setting the value Cp of capacitance of the capacitor element 101 within the range of ±20% of k×(Co+Cload)−Cm, the peak value of crosstalk noise can be effectively reduced.

Second Embodiment

Figure 9:
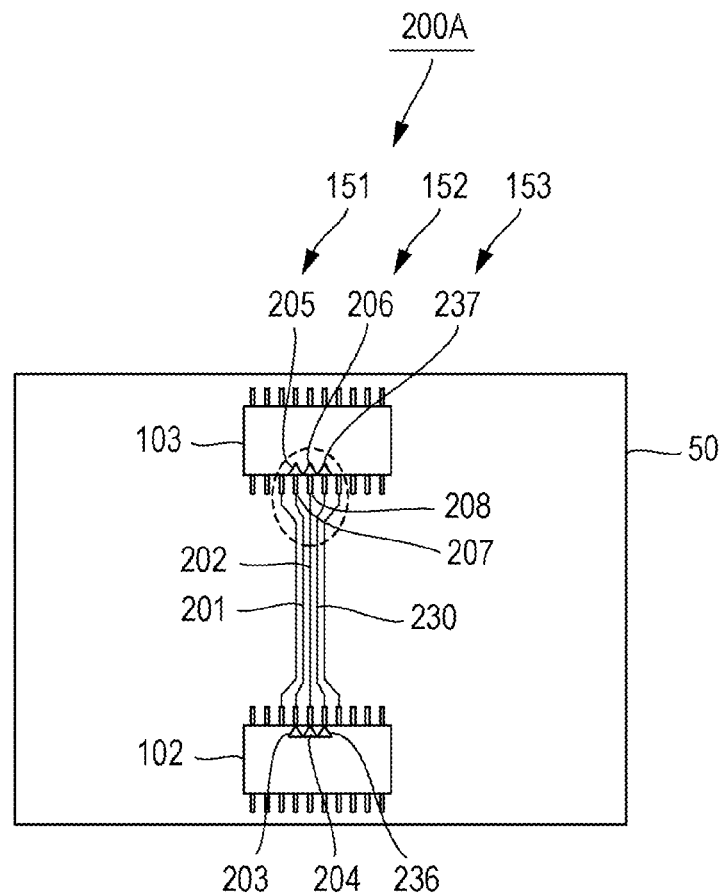
FIG. 9 is a conceptual diagram illustrating a printed circuit board according to a second embodiment.

Next, a printed circuit board according to a second embodiment of the present invention will be described. FIG. 9 is a diagram illustrating the schematic configuration of the printed circuit board according to the second embodiment of the present invention. In this second embodiment, too, a printed circuit board 200A has a substrate 50 and ICs 102 and 103 mounted on the substrate 50. The substrate 50 has a four-layer structure like the substrate 50 according to the first embodiment illustrated in FIG. 2. The IC 102 has signal transmitting units 203, 204, and 236 that transmit (output) signals. In addition, the IC 103 has a plurality of signal receiving units 205, 206, and 237 that receive (input) signals. The signal transmitting units 203, 204, and 236 and the signal receiving units 205, 206, and 237 are connected by signal lines 201, 202, and 230, respectively, provided on the substrate 50. That is, the printed circuit board 200A has a plurality of signal transmitting/receiving systems 151, 152, and 153 that each include a signal transmitting unit, a signal receiving unit, and a signal line. The signal lines 201, 202, and 230 are arranged in parallel to one another and, in order to increase the wiring density, close to one another.

Figure 10:
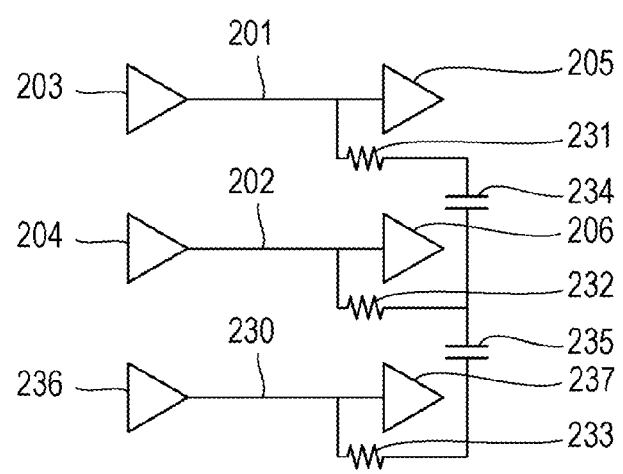
FIG. 10 is a diagram illustrating an equivalent circuit of the printed circuit board according to the second embodiment.

FIG. 10 is a diagram illustrating an equivalent circuit of the printed circuit board 200A. In this second embodiment, the printed circuit board 200A has the same number of resistor element 231, 232, and 233 as that of signal lines connected to the signal lines 201, 202, and 230. In addition, the printed circuit board 200A has capacitor elements 234 and 235 as capacitors connected between two resistor elements connected to two signal lines adjacent to each other in the plurality of signal lines.

Figure 11A:
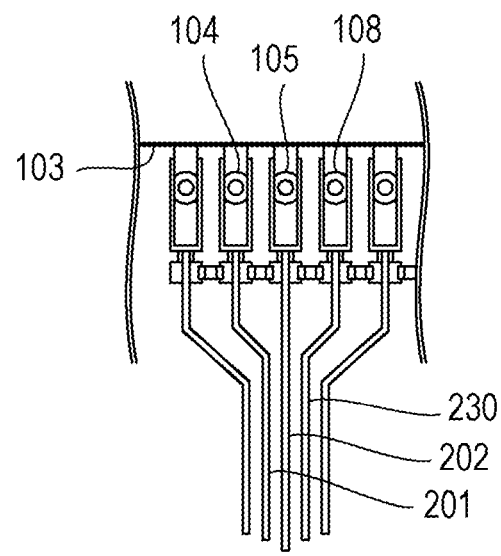
FIGS. 11A and 11B are conceptual diagrams illustrating the connection state of each element around signal receiving units according to the second embodiment.
Figure 11B:
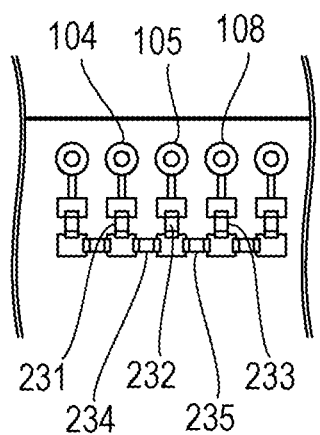

FIGS. 11A and 11B are diagrams illustrating the connection state of each element around the signal receiving units. FIG. 11A is a perspective plan view of a signal line layer that is the first layer and a signal line layer that is the fourth layer of the printed circuit board 200 (substrate 50), which are overlapped for explanatory purposes. FIG. 11B is a plan view of the signal line layer that is the fourth layer. The first layer is formed on one side of the substrate 50 and the fourth layer is formed on another side of the substrate 50. Whereas the ICs 102 and 103 and the signal lines 201, 202, and 230 are provided on the signal line layer on one side of the substrate 50, the resistor elements 231, 232, and 233 and the capacitor elements 234 and 235 are provided on the signal line layer on the other side of the substrate 50.

As illustrated in FIG. 11A, via holes 104, 105, and 108, which are through holes, are formed in the substrate 50 of the printed circuit board 200A. On the signal line layer that is the first layer, the signal lines 201, 202, and 230 run to the via holes 104, 105, and 108, respectively. As illustrated in FIG. 11B, one ends of the resistor elements 231, 232, and 233 provided on the signal line layer that is the fourth layer are connected to the signal lines 201, 202, and 203 through the via hole 104, 105, and 108, respectively. As illustrated in FIG. 11B, the capacitor element 234 is connected between another ends of the two resistor elements 231 and 232 whose one ends are connected to the two signal lines 201 and 202 that are adjacent to each other in the plurality of signal lines 201, 202, and 203. Similarly, the capacitor element 235 is connected between another ends of the two resistor elements 232 and 233 whose one ends are connected to the two signal lines 202 and 230 that are adjacent to each other.

In this second embodiment, the values of resistance, which is the nominal values of the resistor elements 231, 232, and 233, are determined to be Rp/2Ω with tolerances (first tolerances). In addition, the values of capacitance, which are the nominal values of the capacitor elements 234 and 235, are determined to be Cp F with tolerances (second tolerances).

It is to be noted that, although the resistor elements 231, 232, and 233 and the capacitor elements 234 and 235 are arranged close to the IC 103 in FIGS. 11A and 11B, there are no restrictions on positions at which these components are to be arranged, such as distances to the IC 103 and faces of the printed circuit board 200 on which the components are to be arranged. Any type of arrangement is possible so long as these components are connected to the signal line 201, 202, or 230 as described above. In addition, the resistor elements 231, 232, and 233 and the capacitor elements 234 and 235 may be configured by a plurality of materials. If the resistor elements 231, 232, and 233 and the capacitor elements 234 and 235 are configured by a plurality of materials, the sum of the characteristics of each material needs to exhibit the same state as the equivalent circuit illustrated in FIG. 10.

The value of each element according to this second embodiment will be described with reference to the equivalent circuit illustrated in FIG. 10. The structure of the substrate 50 is the same as that according to the first embodiment, and the lengths of the signal lines 201, 202, and 230 are the same as those according to the first embodiment, namely 5 cm. When an electromagnetic field analysis is conducted with this sectional structure, the inductances and the capacitances of the signal lines 201, 202, and 230 can be obtained. If the lengths of the signal lines of 5 cm are taken into consideration, the self-inductance Lo=16 nH, the self-capacitance Co=6.0 pF, the coupled inductance Lm=3.5 nH, and the coupled capacitance Cm=0.96 pF. In addition, the parasitic capacitances Cload of the signal receiving units 205, 206, and 237 are 3.0 pF.

When the value Cp of capacitance is calculated in the same manner using the expression (6), Cp=k×(Co+Cload)−Cm=1.0 [pF]. In addition, in this second embodiment, the value Rp of resistance and the value Cp of capacitance are set such that, in relation to the rise time tr [s] of a signal output from a signal transmitting unit (the signal transmitting unit 203 here), the expression tr/3=Cp×Rp is satisfied. If the rise time tr of the output signal is assumed to be 500 ps, the value Rp of resistance is tr/(3×Cp)=166 [Ω]. At this time, the resistor elements between the signal lines 201 and 202 are the two resistor elements 231 and 232, and the resistor elements between the signal lines 202 and 230 are the two resistor elements 232 and 233. Therefore, the values of resistance of the resistor elements 231, 232, and 233 are all set to 83Ω (Rp/2), so that the combined value of resistance between two signal lines is 166Ω.

Figure 12:
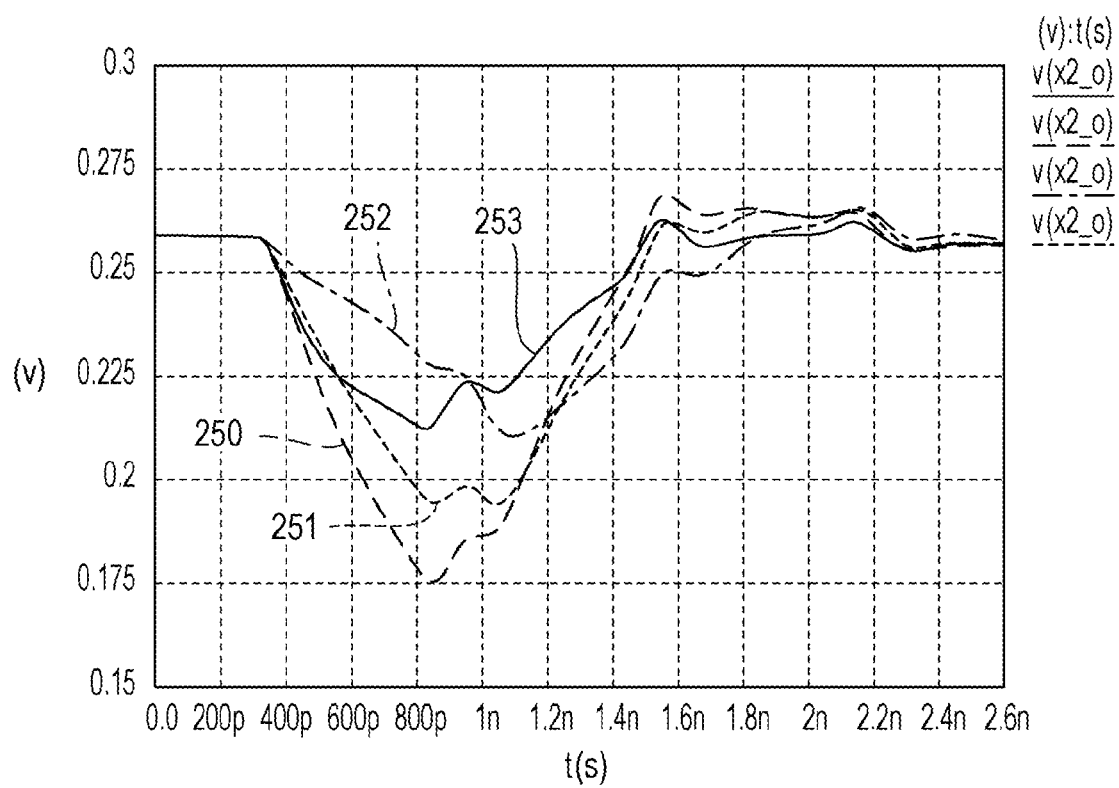
FIG. 12 is a graph illustrating the results of simulation of the waveform of crosstalk noise according to the second embodiment.

In addition, the results of simulation of the waveform of crosstalk noise using the above parameters are illustrated in FIG. 12. The vertical axis represents voltage, and the horizontal axis represents time. The waveforms illustrated in FIG. 12 are waveforms of crosstalk noise at the receiving end 208 when the signal transmitting unit 204 outputs a signal and the signal transmitting units 203 and 236 do not output a signal. A waveform 250 is a waveform of the crosstalk noise when no measures are taken against the crosstalk noise. A waveform 251 is a waveform when only a capacitor element having a value Ca of capacitance of 0.35 pF in the example of the related art is connected. A waveform 252 is a waveform when, although the effect of the parasitic capacitances of the signal receiving units 205 and 206 are taken into consideration, only a capacitor element having a value Cp of capacitance of 1.0 pF is connected. A waveform 253 is a waveform according to this second embodiment in which the capacitor elements 234 and 235 having the values Cp of capacitance and the resistor elements 231, 232, and 233 having the values Rp/2 of resistance are connected. In the waveform 253 according to this second embodiment, the peak value of the crosstalk noise is smaller than in the waveforms 250, 251, and 252.

Because the results of the simulation according to this second embodiment illustrated in FIG. 12 are substantially the same as those of the simulation according to the first embodiment illustrated in FIG. 7B, changes in the parameters can also be regarded as substantially the same.

That is, "setting the values Rp/2 of resistance (that is, the value Rp of resistance) of the resistor elements 231, 232, and 233 such that the expression tr/3=Cp×Rp is satisfied" includes a case in which there is an error between the value calculated for selecting an actual resistor element and the actual value of resistance of the selected resistor element. Similarly, "setting the values Cp of capacitance of the capacitor elements 234 and 235 such that the expression tr/3=Cp×Rp is satisfied" includes a case in which there is an error between the value calculated for selecting an actual capacitor element and the actual value of capacitance of the selected capacitor element. Furthermore, the values of resistance of the resistor elements 231, 232, and 233 normally have tolerances (errors), and the values of capacitance of the capacitor elements 234 and 235 also have tolerances (errors). Therefore, "values that satisfy the expression tr/3=Cp×Rp" may be values that include these tolerances. For example, if each tolerance is ±5%, the value obtained from the expression tr/3=Cp×Rp may be a value that includes a variation of ±10% relative to the rise time tr of an output signal. In addition, so long as the expression tr/3=Cp×Rp is satisfied, the expression Cp=k×(Co+Cload)−Cm need not be strictly satisfied. Even if the values Cp of capacitance are changed within the range of about −20% to 20%, if the values Rp of resistance are set such that the expression tr/3=Cp×Rp is satisfied, the effect of reducing the peak value of the crosstalk noise can be obtained.

In addition, in this second embodiment, if there is a signal line that is adjacent to signal lines on both sides like the signal line 202, the signal line is connected to capacitor elements by a single resistor element. In doing so, in this second embodiment, the number of resistor elements to be arranged on the substrate 50 can be smaller than in the first embodiment.

Third Embodiment

Figure 13:
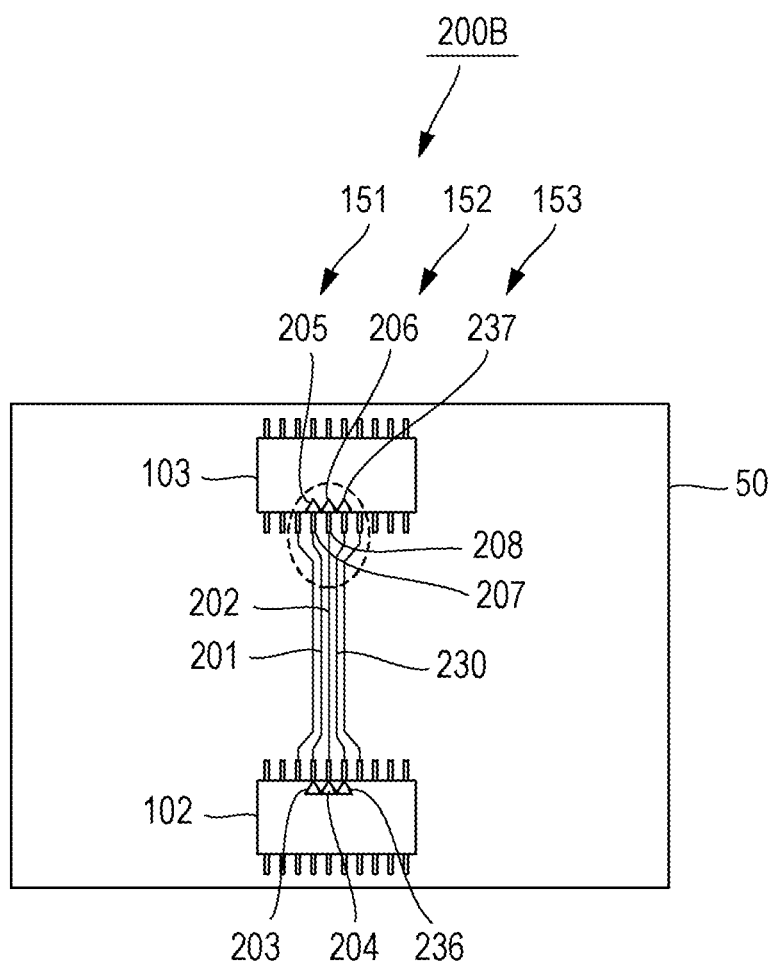
FIG. 13 is a conceptual diagram illustrating a printed circuit board according to a third embodiment.
Figure 14A:
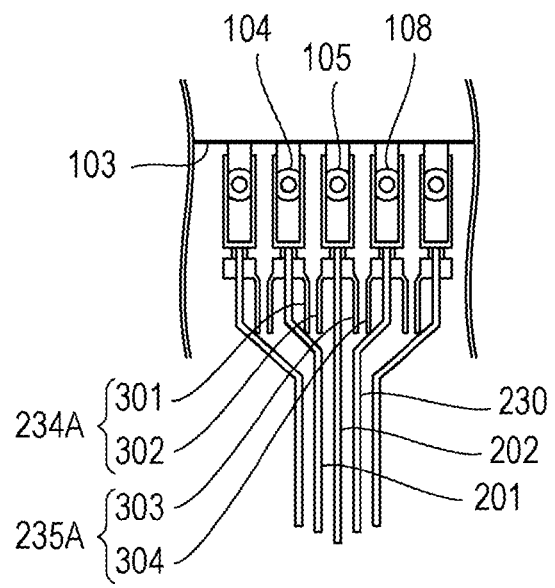
FIGS. 14A and 14B are conceptual diagrams illustrating the connection state of each element around signal receiving units according to the third embodiment.
Figure 14B:
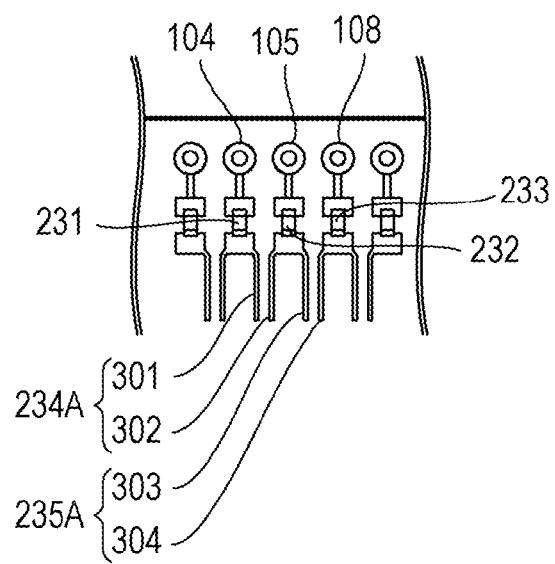
Figure 15A:
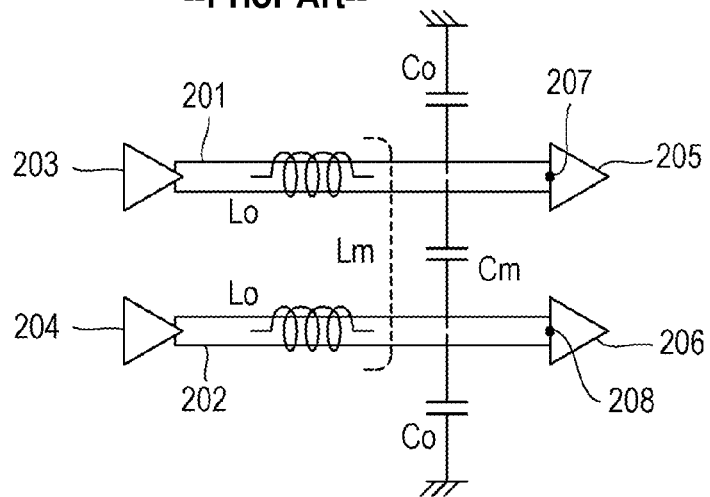
FIG. 15A is a diagram illustrating an equivalent circuit of a printed circuit board in an example of the related art.
Figure 15B:
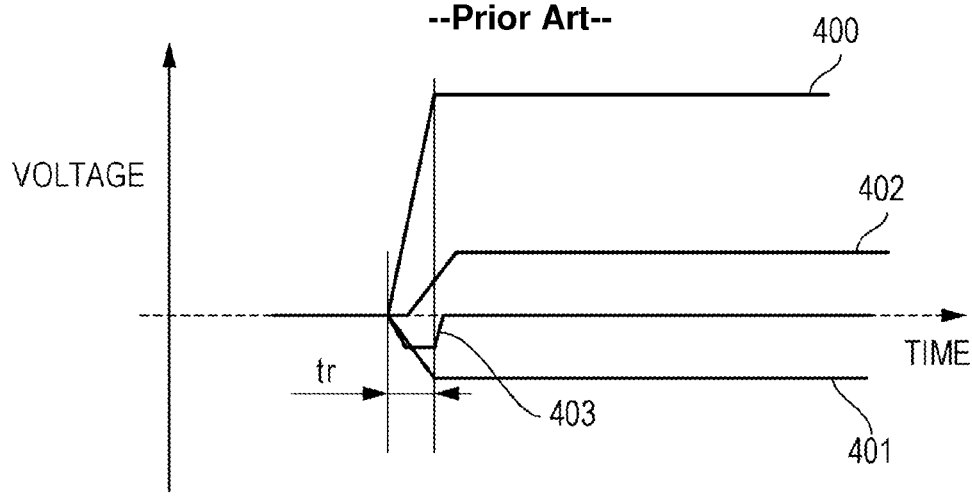
FIG. 15B is a graph illustrating the results of simulation of the waveform of crosstalk noise in the example of the related art.
Figure 15C:
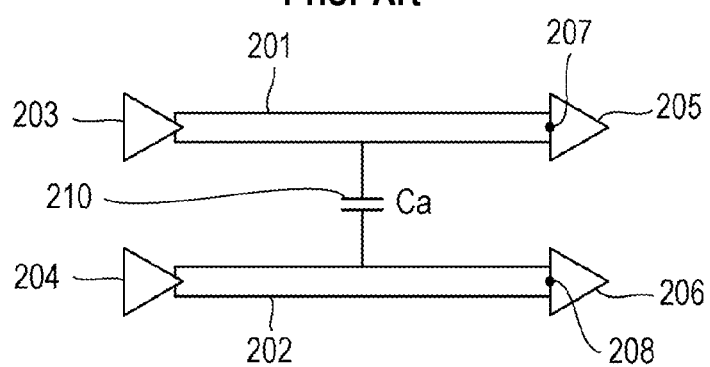
FIG. 15C is a conceptual diagram illustrating the structure of a circuit in the example of the related art.

Next, a printed circuit board according to a third embodiment of the present invention will be described. FIG. 13 is a diagram illustrating the schematic configuration of the printed circuit board according to the third embodiment of the present invention. FIGS. 14A and 14B are diagrams illustrating the connection state of each element around signal receiving units. FIG. 14A is a perspective plan view of a signal line layer that is the first layer and a signal line layer that is the fourth layer of the printed circuit board 200 (substrate 50), which are overlapped for explanatory purposes. FIG. 14B is a plan view of the signal line layer that is the fourth layer. In the second embodiment, a case has been described in which the printed circuit board 200A includes the capacitor elements 234 and 235 as a capacitor. In this third embodiment, the capacitor is different from that according to the second embodiment. Description of other components is omitted by attaching the same reference numerals.

In a printed circuit board 200B according to this third embodiment, as with the second embodiment, ICs 102 and 103 are mounted on a substrate 50 as illustrated in FIG. 13. Signal transmitting units 203, 204, and 236 and signal receiving units 205, 206, and 237 are connected by signal lines 201, 202, and 230, respectively. In FIGS. 14A and 14B, the first layer is formed on one side of the substrate 50, and the fourth layer is formed on another side of the substrate 50. Whereas the ICs 102 and 103 and the signal lines 201, 202, and 230 are formed on the signal line layer on one side of the substrate 50, the resistor elements 231, 232, and 233 and capacitors 234A and 235A are formed on the signal line layer on the other side of the substrate 50.

As illustrated in FIG. 14A, via holes 104, 105, and 108, which are through holes, are formed in the substrate 50 of the printed circuit board 200B. On the signal line layer that is the first layer, the signal lines 201, 202, and 230 run to the via holes 104, 105, and 108, respectively. As illustrated in FIG. 14B, one ends of the resistor elements 231, 232, and 233 provided on the signal line layer that is the fourth layer are connected to the signal lines 201, 202, and 203 through the via hole 104, 105, and 108, respectively. As illustrated in FIG. 14B, a capacitor element 234A is connected between another ends of the two resistor elements 231 and 232 whose one ends are connected to the two signal lines 201 and 202 that are adjacent to each other in the plurality of signal lines 201, 202, and 203. Similarly, a capacitor element 235A is connected between another ends of the two resistor elements 232 and 233 whose one ends are connected to the two signal lines 202 and 230 that are adjacent to each other.

Here, the capacitor element 234A is a pair of lines 301 and 302 that are provided on the signal line layer that is the fourth layer of the substrate 50 and that are disposed in such a way as to face each other. Similarly, the capacitor element 235A is a pair of lines 303 and 304 that are provided on the signal line layer that is the fourth layer of the substrate 50 and that are disposed in such a way as to face each other. As described above, since the capacitor elements 234A and 235A are each configured by a pair of lines, another capacitor element need not be separately provided, thus making it possible to reduce the number of components to be arranged on the substrate 50.

Here, the pair of lines 301 and 302 face each other in the longitudinal direction, and ends thereof on the same side are connected to the signal lines 201 and 202, respectively. The gap between the pair of lines 301 and 302 is 0.01 mm. The length of a line that has the same value of capacitance as the value Cp of capacitance of 1.0 pF of the capacitor element 101 described in the example of the simulation according to the first embodiment is 7.0 mm. In addition, the pair of lines 303 and 304 face each other in the longitudinal direction, and ends thereof on the same side are connected to the signal lines 202 and 230. The gap between the pair of lines 303 and 304 is 0.01 mm. The length of a line that has the same value of capacitance as the value Cp of capacitance of 1.0 pF of the capacitor element 101 described in the example of the simulation according to the first embodiment is 7.0 mm. In addition, if the line 302 and the line 303 are arranged at positions that are the same distance away from the IC 103 and disposed in such a way as to face each other, the gap between the line 302 and the line 303 is 0.22 mm. The value of capacitance generated between the line 302 and the line 303 at this time is 0.029 pF, which is sufficiently small relative to the value of capacitance of 1.0 pF between the line 301 and the line 302 and between the line 303 and the line 304.

It is to be understood that, although the present invention has been described on the basis of the first to third embodiments, the present invention is not limited by these embodiments. Although a case in which a signal is transmitted from the signal transmitting unit 203 has been described, the peak value of crosstalk noise can be reduced even if a signal is transmitted from another signal transmitting unit.

In addition, in the third embodiment, although a case in which the capacitor element according to the second embodiment is configured by a pair of lines as a capacitor has been described, the capacitor element according to the first embodiment may be configured by a pair of lines as a capacitor as in the third embodiment.

In addition, in the first embodiment, although a case in which a resistor is divided into two resistor elements and disposed at both ends of a capacitor element has been described, the present invention is not limited by this case, and the resistor may be arranged at one end of the capacitor element.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-166936 filed Jul. 26, 2010, which is hereby incorporated by reference herein in its entirety.

What is claimed is:

1. A printed circuit board comprising:
   signal transmitting units that transmit signals;
   signal receiving units that receive the signals; and
   a plurality of signal lines that connect the signal transmitting units and the signal receiving units and that are arranged in parallel to one another,
   wherein a resistor element and a capacitor element are connected in series and mounted between any two signal lines that are adjacent to each other in the plurality of signal lines, and
   wherein, if a value of resistance of the resistor element is assumed to be Rp [$\Omega$], a value of capacitance of the capacitor element is assumed to be Cp [F], and rise time of the signals output from the signal transmitting units is assumed to be tr [s], the value Rp of resistance and the value Cp of capacitance are set such that an expression $(Cp \times Rp) \times 0.9 \leq tr/3 \leq (Cp \times Rp) \times 1.1$ is satisfied.

2. The printed circuit board according to claim 1,
   wherein, if self-capacitances of the any two signal lines are assumed to be Co, a coupling capacitance between the any two signal lines is assumed to be Cm, a coupling coefficient between the any two signal lines is assumed to be k, and parasitic capacitances of the signal receiving units are assumed to be Cload, the value Cp of capacitance of the capacitor is set within a range of ±20% of $k \times (Co + Cload) - Cm$.

3. A printed circuit board comprising:
   signal transmitting units that transmit signals;
   signal receiving units that receive the signals; and
   a plurality of signal lines that connect the signal transmitting units and the signal receiving units and that are arranged in parallel to one another,
   wherein two resistor elements and a capacitor element are connected in series and mounted between any two signal lines that are adjacent to each other in the plurality of signal lines, and each of the two resistor elements is connected to either one of the ends of the capacitor, and wherein, if each value of resistance of the two resistor elements is assumed to be Rp [$\Omega$], twice a value of capacitance of the each capacitor element is assumed to be Cp [F], and rise time of the signals output from the signal transmitting units is assumed to be tr [s], the value Rp of resistance and the value Cp of capacitance are set such that an expression $(Cp \times Rp) \times 0.9 \leq tr/3 \leq (Cp \times Rp) \times 1.1$ is satisfied.

* * * * *